US 8,339,150 B2

(12) United States Patent
Jeon et al.

(10) Patent No.: US 8,339,150 B2
(45) Date of Patent: Dec. 25, 2012

(54) SEMICONDUCTOR INTEGRATED CIRCUIT

(75) Inventors: Byung-Deuk Jeon, Gyeonggi-do (KR); Dong-Geum Kang, Gyeonggi-do (KR); Young-Jun Yoon, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 421 days.

(21) Appl. No.: 12/648,736

(22) Filed: Dec. 29, 2009

(65) Prior Publication Data

US 2011/0156738 A1    Jun. 30, 2011

(30) Foreign Application Priority Data

Dec. 28, 2009   (KR) .................... 10-2009-0132114

(51) Int. Cl.
 *G01R 31/20* (2006.01)
(52) U.S. Cl. ......... 324/754.01; 324/762.02; 324/762.06; 324/757.05
(58) Field of Classification Search .............. 324/754, 324/750, 762, 719, 756, 754.01, 754.03, 324/754.07, 754.1, 754.11, 757.04, 762.02, 324/762.06, 757.05
See application file for complete search history.

(56) References Cited

U.S. PATENT DOCUMENTS

| 5,818,252 | A * | 10/1998 | Fullman et al. | 324/762.04 |
|---|---|---|---|---|
| 6,885,212 | B2 * | 4/2005 | Yamamoto et al. | 324/754.03 |
| 7,061,263 | B1 * | 6/2006 | Ong | 324/750.3 |
| 7,400,134 | B2 * | 7/2008 | Morishita et al. | 324/762.02 |
| 7,466,160 | B2 * | 12/2008 | Ong et al. | 324/750.3 |
| 8,063,654 | B2 * | 11/2011 | Rahman et al. | 324/762.03 |
| 2003/0201804 | A1 * | 10/2003 | Waldrop | 327/112 |
| 2006/0232292 | A1 * | 10/2006 | Shimizume et al. | 324/765 |
| 2009/0134391 | A1 * | 5/2009 | Lin | 257/48 |

FOREIGN PATENT DOCUMENTS

| JP | 09-092787 | 4/1997 |
|---|---|---|
| JP | 2003-163246 | 6/2003 |

OTHER PUBLICATIONS

Notice of Allowance issued by the Korean Intellectual Property Office on Nov. 30, 2011.

* cited by examiner

*Primary Examiner* — Huy Q Phan
*Assistant Examiner* — Thang Le
(74) *Attorney, Agent, or Firm* — IP & T Group LLP

(57) ABSTRACT

A semiconductor integrated circuit includes a bump pad through which data is outputted, a probe test pad having a larger size than the bump pad, a first output drive unit configured to drive the bump pad at a first drivability in response to output data, a second output drive unit configured to drive the probe test pad at a second drivability higher than the first drivability in response to the output data, and a multiplexing unit configured to transfer the output data to the first output drive unit or the second output drive unit in response to a test mode signal.

8 Claims, 3 Drawing Sheets

SEMICONDUCTOR INTEGRATED CIRCUIT

CROSS-REFERENCE TO RELATED APPLICATION

The present application claims priority of Korean Patent Application No. 10-2009-0132114, filed on Dec. 28, 2009, which is incorporated herein by reference in its entirety.

BACKGROUND OF THE INVENTION

Exemplary embodiments of the present invention relate to a semiconductor integrated circuit design, and more particularly, to a semiconductor integrated circuit (IC) having a chip-on-chip structure.

A wire bonding technology has been used to integrate a control semiconductor IC and a main semiconductor IC into a single package. However, if semiconductor ICs are packaged using wire bonding, there is a limitation in increasing the operating speed of the semiconductor ICs.

To solve this limitation, a chip-on-chip package technology, which stacks a control semiconductor IC and a main semiconductor IC in a vertical direction, is widely used. The chip-on-chip package technology is a package technology which identifies positions of both bump pads between a control semiconductor IC and a main semiconductor IC, and directly connects both bump pads without the use of wires. Such a chip-on-chip package technology increases an operating frequency due to high-speed signal transmission, reduces total power consumption, and minimizes an entire chip area.

However, if the chip-on-chip package technology is applied, the bump pad size of the semiconductor IC is too small (e.g., 30-μm×30-μm) to perform a probe test on the bump pads in a test mode. Therefore, in order to achieve a normal probe test, a probe test pad having a size of about 60-μm×60-μm must be separately provided.

Meanwhile, in addition to the above-described package technology, a structure in which an input bump pad and an output bump pad are separated from each other is applied to the semiconductor IC having the chip-on-chip structure. Given this structure, a load is further reduced in comparison to the case where data is inputted/outputted using a single bump pad.

Consequently, there is a need for a semiconductor IC design, which is suitable for a probe test, and where input/output bump pads are separated from each other.

SUMMARY OF THE INVENTION

Exemplary embodiments of the present invention are directed to a semiconductor IC having separated input/output bump pads, and is suitable for a probe test.

In accordance with an exemplary embodiment of the present invention, a semiconductor integrated circuit includes a bump pad through which data is outputted, a probe test pad having a larger size than the bump pad, a first output drive unit configured to drive the bump pad at a first drivability in response to output data, a second output drive unit configured to drive the probe test pad at a second drivability higher than the first drivability in response to the output data, and a multiplexing unit configured to connect the output data to the first output drive unit or the second output drive unit in response to a test mode signal.

In accordance with another embodiment of the present invention, a main semiconductor integrated circuit, which is packaged with a control semiconductor integrated circuit in a chip-on-chip structure, includes a first bump pad through which data is outputted to the control semiconductor integrated circuit, a probe test pad having a larger size than the first bump pad, a first output drive unit configured to drive the first bump pad at a first drivability in response to output data, a second output drive unit configured to drive the probe test pad at a second drivability higher than the first drivability in response to the output data, a multiplexing unit configured to connect the output data to the first output drive unit or the second output drive unit in response to a test mode signal, and a second bump pad through which data is inputted from the control semiconductor integrated circuit.

DESCRIPTION OF SPECIFIC EMBODIMENTS

Figure 1:
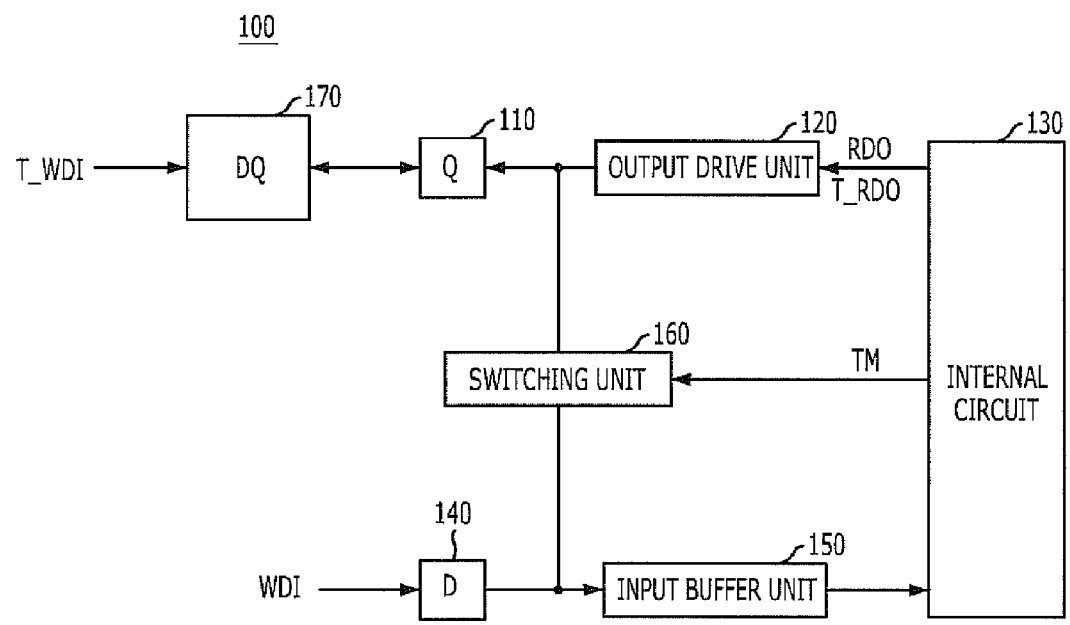
FIG. 1 is a block diagram of a main semiconductor IC.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

A main semiconductor IC will be described below as an example of a semiconductor IC having a chip-on-chip structure.

FIG. 1 is a block diagram of a main semiconductor IC.

Referring to FIG. 1, the main semiconductor IC 100 includes an output bump pad 110 through which output data RDO is transferred to a control semiconductor IC (not shown). The output bump pad 110 may be 20-30 μm×20-30 μm in size. It is apparent that the size of the output bump pad 110 may be larger or smaller.

An output drive unit 120 is provided to drive the output bump pad 110 in response to output data generated from an internal circuit 130.

The main semiconductor IC 100 further includes an input bump pad 140 through which input data WDI is inputted from the control semiconductor IC (not shown). Like the output bump pad 110, the input bump pad 140 may be 20-30 μm×20-30 μm in size.

An input buffer unit 150 is provided to buffer the input data WDI inputted through the input bump pad 140, and transfer the buffered input data WDI to the internal circuit 130.

Furthermore, a switching unit 160 is provided to selectively connect the output bump pad 110 to the input buffer unit 150 in response to a test mode signal TM generated from the internal circuit 130. That is, the switching unit 160 functions to connect the output bump pad 110 to the input buffer unit 150 in response to the test mode signal TM in order to perform a probe test through a probe test pad 170. Although the test mode signal TM generated from the internal circuit 130 is illustrated, the invention is not limited thereto. For example, the test mode signal TM may be transferred from an external circuit (e.g., a control semiconductor IC) in response to the circuit configuration.

Figure 2:
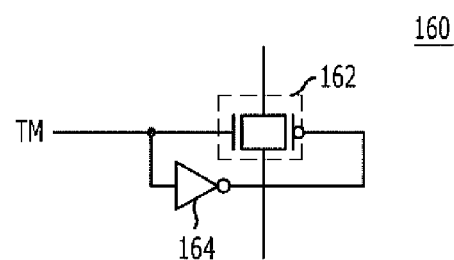
FIG. 2 is a circuit diagram of a switching unit illustrated in FIG. 1.

FIG. 2 is a circuit diagram of the switching unit 160 illustrated in FIG. 1.

Referring to FIG. 2, the switching unit 160 includes a transfer gate 162 and an inverter 164. The transfer gate 162 is configured to be turned on/off in response to a logic level of the test mode signal TM. For example, when the test mode signal TM is at a logic high level, the transfer gate 162 is turned on to connect the output bump pad 110 to the input buffer unit 150. Conversely, for example, when the test mode signal TM is at a logic low level, the transfer gate 162 is turned off, so that the output bump pad 110 is not connected to the input buffer unit 150. It is apparent that the internal configuration of the switching unit 160 may be modified in various manners.

Referring again to FIG. 1, the main semiconductor IC 100 includes the probe test pad 170 for the probe test. The size of the probe test pad 170 is larger than the size of the output bump pad 110. For example, the probe test pad 170 may be approximately 60 μm×600 μm in size, assuming a minimum pitch at which a probe tip (not shown) can be accommodated in the probe test.

Hereinafter, the operation of the probe test operation in the main semiconductor IC having the above-described configuration will be described in detail.

In a normal mode, the internal circuit 130 applies the test mode signal TM of the logic low level to the switching unit 160.

The switching unit 160 is kept in an open state in response to the test mode signal TM of the logic low level.

At this time, when the output data RDO is generated from the internal circuit 130, the output drive unit 120 drives the output bump pad 110. When the input data WDI is transferred from an external circuit through the input bump pad 140, the input data WDI is buffered by the input buffer unit 150, and transferred to the internal circuit 130. In this case, due to the switching unit 160, an output line and an input line are not affected by the load.

However, in a state where the operation mode changes to the test mode (i.e., for example, where the test mode signal TM changes to a logic high level), the switching unit 160 is closed. Therefore, the output bump pad 110 and the input buffer unit 150 are connected together, and preparation for the probe test is completed.

When the preparation for the probe test is completed, a probe tip is accommodated on the probe test pad 170, and the test operation is performed. First, when test input data T_WDI is applied through the probe tip to the probe test pad 170, the test input data T_WDI sequentially passes through the output bump pad 110, the switching unit 160, and the input buffer unit 150, and is then inputted to the internal circuit 130. When test output data T_RDO is generated from the internal circuit 130 in response to a predefined read command signal, the output drive unit 120 drives the output bump pad 110 to transfer the test output data T_RDO to the output bump pad 110. The test output data T_RDO is then transferred to the probe tip.

As such, the main semiconductor IC 100 may perform the input/output probe test using the single probe test pad 170. However, when the probe test is accommodated on the probe test pad 170 in order to perform the probe test, the load of the probe tip itself may prevent the test output data T_RDO from being detected through the probe test pad 170. In other words, if the drivability of the output drive unit 120 is not set to be sufficiently high for the test mode, the probe tip itself may prevent the stable transfer of the test output data T_RDO.

Figure 3:
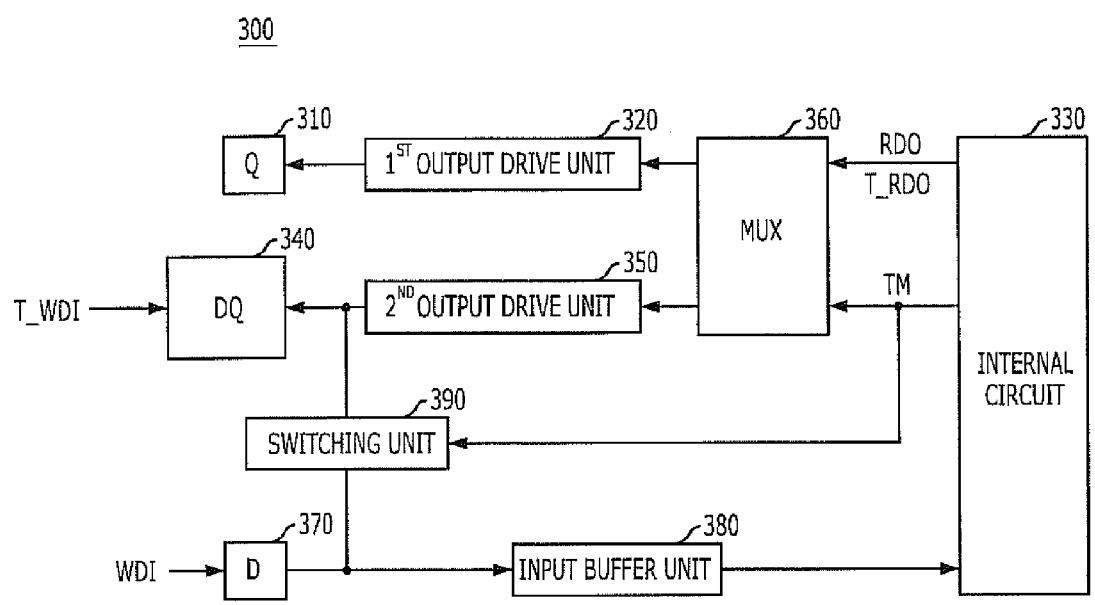
FIG. 3 is a block diagram of a main semiconductor IC in accordance with an embodiment of the present invention.
Figure 4A:
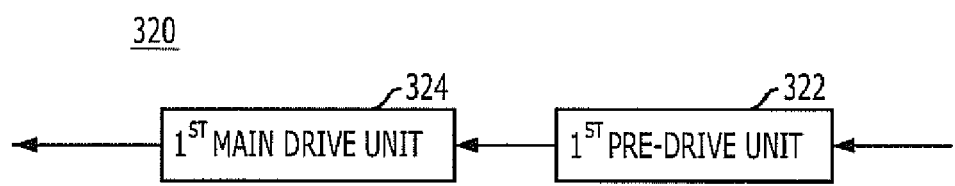
FIGS. 4A and 4B are block diagrams illustrating the internal configurations of a first output drive unit and a second output drive unit illustrated in FIG. 3.
Figure 4B:
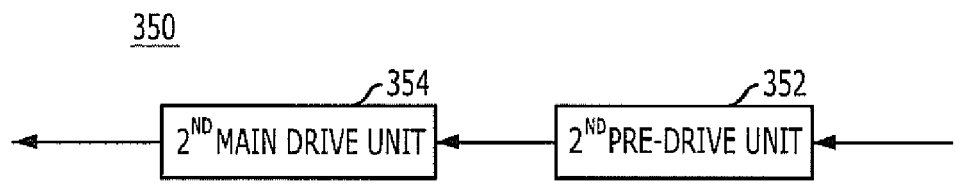

FIG. 3 is a block diagram of a main semiconductor IC in accordance with an embodiment of the present invention. FIG. 4A is a block diagram illustrating the internal configuration of a first output drive unit illustrated in FIG. 3, and FIG. 4B is a block diagram illustrating the internal configuration of a second output drive unit illustrated in FIG. 3.

Referring to FIG. 3, the main semiconductor IC 300 includes an output bump pad 310 through which output data RDO is transferred to a control semiconductor IC (not shown). The output bump pad 310 may be 20-30 μm×20-30 μm in size. It is apparent that the size of the output bump pad 310 may be larger or smaller.

Furthermore, a first output drive unit 320 is provided to drive the output bump pad 310 in response to the output data RDO generated from an internal circuit 330. Referring to FIG. 4A, the first output drive unit 320 includes a first pre-drive unit 322 and a first main drive unit 324. The first pre-drive unit 322 is configured to output a first driving control signal in response to the output data RDO, and the first main drive unit 324 is configured to drive the output bump pad 310 in response to the first driving control signal. The first main drive unit 324 has a first drivability for driving the output bump pad 310.

Referring again to FIG. 3, the main semiconductor IC 300 further includes a probe test pad 340 for use in a probe test. The probe test pad 340 has a larger size than the output bump pad 310. For example, the probe test pad 340 may be about 60-μm×60-μm in size, assuming a minimum pitch at which a probe tip (not shown) can be accommodated in the probe test.

Furthermore, a second output drive unit 350 is provided to drive the probe test pad 340 in response to the output data RDO. Referring to FIG. 4B, the second output drive unit 350 includes a second pre-drive unit 352 and a second main drive unit 354. The second pre-drive unit 352 is configured to output a second driving control signal in response to the output data RDO, and the second main drive unit 354 is configured to drive the probe test pad 340 in response to the second driving control signal. The second main drive unit 354 has a second drivability for driving the probe test pad 340, which accommodates the probe tip. The second drivability of the second main drive unit 354 is higher than the first drivability of the first main drive unit 324.

Referring again to FIG. 3, a multiplexing unit 360 is provided to transfer the output data RDO to the first output drive unit 320 or the second output drive unit 350 in response to the test mode signal TM generated from the internal circuit 330. For example, the multiplexing unit 360 may be implemented with a multiplexer (MUX). Although the test mode signal TM generated from the internal circuit 330 is illustrated, the invention is not limited thereto. For example, the test mode signal TM may be transferred from an external circuit (e.g., a control semiconductor IC).

The main semiconductor IC 300 further includes an input bump pad 370 through which input data WDI is inputted from a control semiconductor IC (not shown). Like the output bump pad 310, the input bump pad 370 may be 20-30 μm×20-30 μm in size.

The main semiconductor IC further includes an input buffer unit 380 configured to buffer the input data WDI inputted through the input bump pad 310, and transfer the buffered input data WDI to the internal circuit 330.

A switching unit 390 is provided to selectively connect the probe test pad 340 to the input buffer unit 380 in response to the test mode signal TM. When the probe test is performed on the input data, the switching unit 390 functions to connect the probe test pad 340 to the input buffer unit 380. Since the internal configuration of the switching unit 390 is described above, its detailed description will be omitted (see FIG. 2).

Meanwhile, although not shown, an electrostatic discharge (ESD) protection circuit may be provided between the output bump pad 310 and the first output drive unit 320, and between the input bump pad 370 and the input buffer unit 380.

The probe test operation of the main semiconductor IC 300 having the above-described configuration in accordance with the embodiment of the present invention will be described below in detail.

In a normal mode, the test mode signal TM of a logic low level, which is generated from the internal circuit 310, is applied to the multiplexing unit 360 and the switching unit 390. In response, the switching unit 390 is kept in an open state in response to the test mode signal TM of the logic low level. Additionally, the multiplexing unit 360 connects a transmission line for the output data RDO to the first output drive unit 320 in response to the test mode signal TM of the logic low level.

At this time, when a read command signal is generated, the internal circuit 330 generates the corresponding output data RDO, and transfers the generated output data RDO to the first output drive unit 320. The first pre-drive unit 322 outputs the first driving control signal in response to the output data RDO. Further, the first main drive unit 324 drives the output bump pad 310 at the first drivability in response to the first driving control signal, so that the output data RDO is transferred to the external circuit.

Furthermore, when the input data WDI is inputted from an external circuit through the input bump pad 370, the input data WDI is buffered by the input buffer unit 380, and transferred to the internal circuit 330.

However, in a state where the operation mode changes to the test mode (i.e., for example, where the test mode signal TM changes to a logic high level), the switching unit 390 is closed. Therefore, the probe test pad 340 and the input buffer unit 380 are connected together. Simultaneously, the multiplexing unit 360 connects the output line for the test output data T_RDO to the second output drive unit 350 in response to the test mode signal TM of the logic high level.

Here, when the preparation for the probe test is completed, a probe tip is applied to the probe test pad 340, and the test operation is performed. First, when test input data T_WDI is applied through the probe tip to the probe test pad 340, the test input data T_WDI passes through the switching unit 390 and is buffered by the input buffer unit 380. Then, the buffered test input data T_WDI is inputted to the internal circuit 330.

When the test output data T_RDO is generated from the internal circuit 330 in response to the read command signal, the second output drive unit 350, connected by the multiplexing unit 360, drives the probe test pad 340 thereby transferring the test output data T_RDO to the probe tip. More specifically, the second pre-drive unit 352 outputs the second driving control signal in response to the test output data T_RDO, and the second main drive unit 354 drives the probe test pad 340 in response to the second driving control signal, and transfers the test output data T_RDO to the probe tip. At this time, since the second main drive unit 354 has a second drivability great enough to drive both the probe test pad 340 and the probe tip applied to the probe test pad 340, the probe test pad 340 and the probe tip can be driven stably. In other words, the test output data T_RDO may be successfully outputted despite the effect of the probe tip.

In the main semiconductor IC in accordance with the exemplary embodiments of the present invention, in which the input/output bump pads are separated from each other, the input/output probe test may be performed through the single probe test pad. In particular, since the probe test pad and the probe tip are driven at the corresponding drivability in the output probe test, the reliability of the probe test operation is improved.

The semiconductor IC in accordance with the exemplary embodiment of the present invention includes the single probe test pad, as well as the input/output bump pad, and performs the input/output test through the probe test pad in the probe test. In particular, since the second output drive unit for driving the probe test pad in the output test is set to have a drivability high enough to drive both the probe test pad and the probe tip applied to the probe test pad, the reliability of the probe test operation is improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit, comprising:
a bump pad through which data is outputted;
a probe test pad having a larger size than the bump pad;
a first output drive unit configured to drive the bump pad at a first drivability in response to output data;
a second output drive unit configured to drive the probe test pad at a second drivability higher than the first drivability in response to the output data; and
a multiplexing unit configured to transfer the output data to the first output drive unit or the second output drive unit in response to a test mode signal,
an input buffer unit configured to buffer input data;
a switching unit configured to selectively couple the probe test pad to the input buffer unit in response to the test mode signal.

2. The semiconductor integrated circuit of claim 1, wherein the first output drive unit comprises:
a first pre-drive unit configured to output a first driving control signal in response to the output data; and
a first main drive unit configured to drive the bump pad at the first drivability in response to the first driving control signal.

3. The semiconductor integrated circuit of claim 2, wherein the second output drive unit comprises:
a second pre-drive unit configured to output a second driving control signal in response to the output data; and
a second main drive unit configured to drive the probe test pad at the second drivability in response to the second driving control signal.

4. The semiconductor integrated circuit of claim 1, wherein the multiplexing unit is configured to transfer the output data to the second output drive unit when the test mode signal is activated.

5. A main semiconductor integrated circuit, which is packaged with a control semiconductor integrated circuit in a chip-on-chip structure, the main semiconductor integrated circuit comprising:
a first bump pad through which data is outputted to the control semiconductor integrated circuit;
a probe test pad having a larger size than the first bump pad;
a first output drive unit configured to drive the first bump pad at a first drivability in response to output data;
a second output drive unit configured to drive the probe test pad at a second drivability higher than the first drivability in response to the output data;

a multiplexing unit configured to transfer the output data to the first output drive unit or the second output drive unit in response to a test mode signal; and a second bump pad through which data is inputted from the control semiconductor integrated circuit;

an input buffer unit configured to buffer data transferred through the second bump pad; and a switching unit configured to selectively connect the probe test pad to the input buffer unit in response to the test mode signal.

6. The main semiconductor integrated circuit of claim 5, wherein the first output drive unit comprises:

a first pre-drive unit configured to output a first driving control signal in response to the output data; and a first main drive unit configured to drive the first bump pad at the first drivability in response to the first driving control signal.

7. The main semiconductor integrated circuit of claim 6, wherein the second output drive unit comprises:

a second pre-drive unit configured to output a second driving control signal in response to the output data; and a second main drive unit configured to drive the probe test pad at the second drivability in response to the second driving control signal.

8. The main semiconductor integrated circuit of claim 5, wherein the multiplexing unit is configured to transfer the output data to the second output drive unit when the test mode signal is activated.

* * * * *